(12) United States Patent
Amami et al.

(10) Patent No.: US 6,468,448 B1
(45) Date of Patent: Oct. 22, 2002

(54) CONDUCTIVE COMPOSITION, CONDUCTIVE ADHESIVE, AND THEIR MOUNTING STRUCTURE

(75) Inventors: Kazuyoshi Amami, Osaka; Emiko Igaki, Hyogo; Minehiro Itagaki, Osaka, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/691,183

(22) Filed: Oct. 19, 2000

(30) Foreign Application Priority Data

Oct. 22, 1999  (JP) .............................. 11-300534

(51) Int. Cl.[7] .......................... H01B 1/06; H01L 23/29
(52) U.S. Cl. .................. 252/520; 252/518; 252/521; 174/257; 257/783; 257/789; 257/795
(58) Field of Search .................. 252/514, 520, 252/521, 518; 174/257; 257/783, 789, 795

(56) References Cited

U.S. PATENT DOCUMENTS

| | | | | | |
|---|---|---|---|---|---|
| 4,023,961 A | * | 5/1977 | Douglas et al. | .......... | 75/0.5 AC |
| 4,687,597 A | * | 8/1987 | Siuta | .......... | 252/512 |
| 5,126,915 A | * | 6/1992 | Pepin et al. | .......... | 361/304 |
| 5,171,480 A | * | 12/1992 | Yoshinaka et al. | .......... | 252/518 |
| 5,439,852 A | * | 8/1995 | Hormadaly | .......... | 252/514 |

* cited by examiner

Primary Examiner—Cathy Lam
(74) Attorney, Agent, or Firm—McDermott, Will & Emery

(57) ABSTRACT

A pH adjusting agent is added to a conductive adhesive to prevent the dissolution of a conductive particle to improve the reliability of a mounting structure, wherein when a pH environment is produced in which the conductive particle is easy to dissolve in the surrounding of the conductive adhesive, the pH adjusting agent can change the pH environment to a pH environment in which the conductive particle is resistant to dissolving.

34 Claims, 3 Drawing Sheets

CONDUCTIVE COMPOSITION, CONDUCTIVE ADHESIVE, AND THEIR MOUNTING STRUCTURE

BACKGROUND OF THE INVENTION

1. Field of the Invention

The present invention relates to a conductive composition, a conductive adhesive, and amounting structure of an electronic part using the same.

2. Description of the Related Art

Conventionally, a wire bonding method using solder has been often used when a semiconductor device such as an integrated circuit chip or the like is mounted on the input/output terminal electrodes of a circuit board. However, in recent years, in order to reduce the size of the semiconductor device and to increase the number of connection terminals thereof, the gap between the connection terminals of the semiconductor device is narrowed, which results in gradually making it difficult to mount the semiconductor on the input/output terminal electrodes of the circuit board by the use of a conventional soldering technology.

Accordingly, an attempt has been recently made to reduce the mounting area of the semiconductor device by directly mounting the semiconductor device on the input/output terminal electrodes of the circuit board. Among all, a structure of a flip chip mounting in which the semiconductor device is mounted face down on the circuit board is useful because the structure can electrically connect the semiconductor device to the circuit board by one operation and can produce a large mechanical strength after they are connected to each other.

As the flip chip mounting structure, there are structures in which electrical connections are established by the use of solder, an anisotropic conductive sheet, or a conductive adhesive. FIG. 3 shows a schematic cross sectional view of s flip chip mounting structure in which electrical connections are established by the use of a conductive adhesive. As shown in FIG. 3, in the case where the electrode pad 3 of an IC board 1 is connected to the input/output terminal electrode 7 of a circuit board 4, first, a projecting electrode 2 which is to be an electrical connection point is formed on the electrode pad 3 of the IC board 1 by a wire bonding method or a plating method, and then a conductive adhesive layer 5' is formed on the projecting electrode 2 by a transfer method.

Next, the semiconductor device is aligned face down such that the projecting electrode 2 is put into contact with the top of the input/output terminal electrode 7 and is then mounted on the circuit board 4. Then, the mounting structure of the semiconductor device is heated to high temperatures to cure the conductive adhesive 5' to establish the electrical connections.

In this connection, in order to further reinforce the electrical connections, as shown in FIG. 3, the gap between the IC board 1 and the circuit board 4 is sometimes sealed with a sealing resin 6. In this case, a process of sealing and curing the sealing resin 6 is further required.

In this manner, the flip chip mounting structure is fabricated and as a portable digital devices has been reduced in size, a higher mounting density has been strongly required even in the mounting structure of the semiconductor device. Accordingly, even in the flip chip mounting structure described above, the gap between the connection terminals (the gap between the projecting electrodes 2 and the gap between the input/output terminal electrodes 7) has been further narrowed. In the mounting structure having the narrowed gap between the terminals, it is important whether reliability can be maintained or not.

Therefore, the inventors of the present case conducted an accelerated life test for investigating the reliability of a mounting structure which had a DC voltage applied across input/output terminals 7 in the state of high temperature and high humidity. As a result, the inventors found that the following phenomenon occurred: that is, when the above accelerated life test was conducted, water enters the inside of the mounting structure; when the entered water reached the surrounding of the adhesive layer 5', the conductive particles contained in the conductive adhesive layer 5' dissolved in the water having reached the surrounding of the adhesive layer 5'; and as a result, the conductive particle in the connection portion was reduced in quantity to gradually increase a connection resistance. Such a phenomenon in which the increasing connection resistance was further increased as the gap between the terminals was narrowed with the increasing mounting density.

SUMMARY OF THE INVENTION

Therefore, it is the object of the invention to prevent a connection resistance from being increased by the dissolution of conductive particles.

In order to accomplish the above object, according to the present invention, in short, a pH adjusting agent is added to a conductive adhesive including at least one of resin and rubber, and a conductive particle, whereby when the ambient atmosphere of the conductive adhesive starts to be changed to a pH region in which the conductive particle is easy to dissolve, the pH adjusting agent changes the ambient atmosphere to a stable pH region in which the conductive particle resists dissolving by the neutralization action of the pH adjusting agent, which results in preventing the dissolution of the conductive particle in the surrounding.

It is essential only that the pH adjusting agent in accordance with the present invention can change a pH environment in which the conductive particle is easy to dissolve in the surrounding of the conductive adhesive to a pH environment in which the conductive particle is resistant to dissolving.

The pH adjusting action in accordance with the present invention is required to be selectively produced in a state in which there is a possibility that the conductive particle may dissolve. This is because if the pH adjusting action is produced in a state in which there is no possibility that the conductive particle may dissolve, there is a possibility that the pH adjusting action may have a bad effect on the various characteristics of the conductive adhesive (including electric characteristics).

The state in which there is a possibility that the conductive particle may dissolve, if it is carefully examined, is a state in which water enters the surrounding of the conductive adhesive. In view of this, the pH adjusting agent in accordance with present invention includes a water-soluble substance, whereby the pH adjusting action can be selectively produced in a state in which there is a possibility that the conductive particle may dissolve.

In this case, if the pH adjusting agent includes a substance which is in a solid state in the storage environment and/or actual use environment of the conductive composition, it can be surely prevented that the pH adjusting agent dissolves in the ordinary storage environment and/or actual use environment of the conductive composition.

Further, if the pH adjusting agent is added in a state of powder to the conductive adhesive, it is possible to uniformly arrange the pH adjusting agent in the conductive adhesive. This can uniformly produce the pH adjusting action in the conductive adhesive, which can further surely produce an effect of preventing the conductive composition from dissolving in the surrounding of the conductive adhesive.

Here, it is preferable that the particle size of the pH adjusting agent is smaller than the particle size of the conductive particle. The reason for this will be described in the following: in the case where the particle size of the pH adjusting agent is larger than the particle size of the conductive particle, there is a possibility that the electrical conduction produced by the contact of the conductive particles maybe impaired by the pH adjusting agent having a large particle size; in contrast to this, by making the particle size of the pH adjusting agent smaller than the particle size of the conductive particle, it is possible to prevent the electrical conduction from being impaired by the pH adjusting agent. To be more specific, it is preferable that the particle size of the pH adjusting agent is smaller than 20 $\mu$m. In the case where the particle size of the pH adjusting agent is smaller than 20 $\mu$m, it is as usual easy to control the amount of transfer of the conductive adhesive to an electrode or the like.

A conductive particle containing Ag, Al, Au, Cu, or Ni is usually used. Therefore, according to the present invention, if the ambient atmosphere of the conductive adhesive containing such a conductive particle starts to change to a pH region in which Ag, Al, Au, Cu, or Ni is easy to dissolve, the neutralization action of the pH adjusting agent can return the pH region to a stable pH region in which Ag, Al, Au, Cu, or Ni is resistant to dissolving, which can prevent Ag, Al, Au, Cu, or Ni from dissolving in the surrounding.

Also, it is preferable that the pH adjusting agent is added to the conductive adhesive at a rate of from 0.1 wt % to 10.0 wt % to the conductive particle. This can produce a pH adjusting action of preventing the dissolution of the conductive particle with a volume specific resistance kept at a sufficiently low value.

Further specifically describing the present invention, a pH adjusting agent having a stable region in an alkaline region is added to the conductive adhesive containing conductive particles (for example, Ag) showing lower solubility in an alkaline region than in an acid region. This constitution produces the following action: that is, even if the ambient atmosphere of the conductive adhesive starts to change to the acid region in which the conductive particle is easy to dissolve, the neutralization action of the pH adjusting agent having a stable region in the alkaline region can return the ambient atmosphere to the stable alkaline region in which the conductive particle is resistant to dissolving. As a result, this can prevent the conductive particle from dissolving in the surrounding.

Also, it is possible to constitute the present invention by a substance having a property opposite to the properties of the above mentioned substances. That is, a pH adjusting agent having a stable region in the acid region is added to the conductive adhesive containing a conductive particle showing lower solubility in the acid region than in the alkaline region (for example, Al), whereby even if the ambient atmosphere of the conductive composition starts to change to the alkaline region in which the conductive particle is easy to dissolve, the neutralization action of the pH adjusting agent having a stable region in the acid region can return the ambient atmosphere of the conductive composition to a stable acid region in which the conductive particle is resistant to dissolving. As a result, this can prevent the conductive particle from dissolving in the surrounding.

In this connection, as the pH adjusting agent having the stable region in the alkaline region, there is an agent including at least one member selected from the group consisting of $MgO$, $Mg(OH)_2$, $2MgO \cdot SiO_2$, $Al_2O_3$, $BaCO_3$, $SnO_2$, $La_2O_3$, $Mn_3O_4$, $MnO_2$, $CaCO_3$, $Ca(OH)_2$, $BaTiO_3$, $ZnO$, $CuO$, $Y_2O_3$, $Bi_2O_3$, $Pr_2O_3$, $Pm_2O_3$, $Nd_2O_3$, $Y(OH)_3$, $Sc(OH)_3$, $Ce(OH)_3$, $Sm(OH)_3$, $Eu(OH)_3$, $Gd(OH)_3$, $Tb(OH)_3$, $Dy(OH)_3$, $Ho(OH)_3$, $Er(OH)_3$, $Tm(OH)_3$, $Yb(OH)_3$, $Lu(OH)_3$, $ZrO_2$, $Fe(OH)_2$, $Co(OH)_2$, $Ni(OH)_2$, $Cu(OH)_2$, $Cd(OH)_2$, $Zn(OH)_2$, $La(OH)_3$, $Pr(OH)_3$, $Be(OH)_2$, $Al(OH)_3$, $V_2O_4$, $Cr(OH)_3 \cdot nH_2O$, $Ga(OH)_2$, and $PbO$. Among these members, $MgO$, $Mg(OH)_2$, $2MgO \cdot SiO_2$, or $Ca(OH)_2$ has an excellent pH adjusting action as the pH adjusting agent of the conductive adhesive and hardly has a bad effect on the various characteristics necessary for the conductive adhesive (for example, electric characteristics)

Also, as the pH adjusting agent having the stable region in the acid region, there is an agent including at least one member selected from the group consisting of $In_2O_3$, $TeO_2$, $GeO_2$, $WO_3$, $Gd(OH)_3$, $BeO$, $Cr_2O_3$, $V_2O_5$, $Be(OH)_2$, $Al(OH)_3$, $V_2O_4$, $Cr(OH)_3 \cdot nH_2O$, $Ga(OH)_2$, and $PbO$.

If the mounting structure of an electronic part is constituted by the conductive adhesive in accordance with the present invention having the above mentioned characteristics, it is possible to provide the mounting structure having a stable reliability.

BRIEF DESCRIPTION OF THE DRAWINGS

The other object of the present invention will be clear, if the preferred embodiments described below are understood, and will be clearly claimed in the appended claims. Putting the present invention into practice will remind a person skilled in this art of many advantages which will not be described in the present specification.

DETAILED DESCRIPTION OF THE INVENTION

The preferred embodiments in accordance with the present invention will be described with reference to the accompanying drawings.

(First Preferred Embodiment)

In the preferred embodiment, the present invention is applied to a conductive adhesive containing an epoxy base resin as a resin and Ag as a conductive particle.

Ag as the conductive particle is a metal having low solubility in an alkaline region and high solubility in an acid region. Accordingly, if there exists acid water in an ambient atmosphere, the dissolution of the conductive particles made of Ag is facilitated to increase the connection resistance of the conductive adhesive. In this connection, it is thought to be caused by various factors such as a combination of the material of a circuit board and the material of a sealing resin that the pH of the ambient atmosphere is deviated from a neutral state. In particular, it is caused by the material of the circuit board and additives thereof. In an ordinary circuit board containing a resin component as a main component, the pH of the ambient atmosphere tends to be biased to an acid region.

In the present preferred embodiment, a water-soluble substance MgO was added in the state of powder as a pH adjusting agent, and this pH adjusting agent MgO was formulated at the rate of 0.5 wt % to the conductive particles made of Ag and was then mixed with an epoxy base resin by a publicly known method to make a conductive adhesive.

The MgO as the pH adjusting agent is a substance which is in a solid state in the storage environment and/or the actual use environment of the conductive adhesive, and keeps the solid state (the state of powder) and does not dissolve as far as it does not contact water. Also, the MgO has a stable region in the alkaline region and if it dissolves in the acid region, it neutralizes the surrounding.

Figure 1:
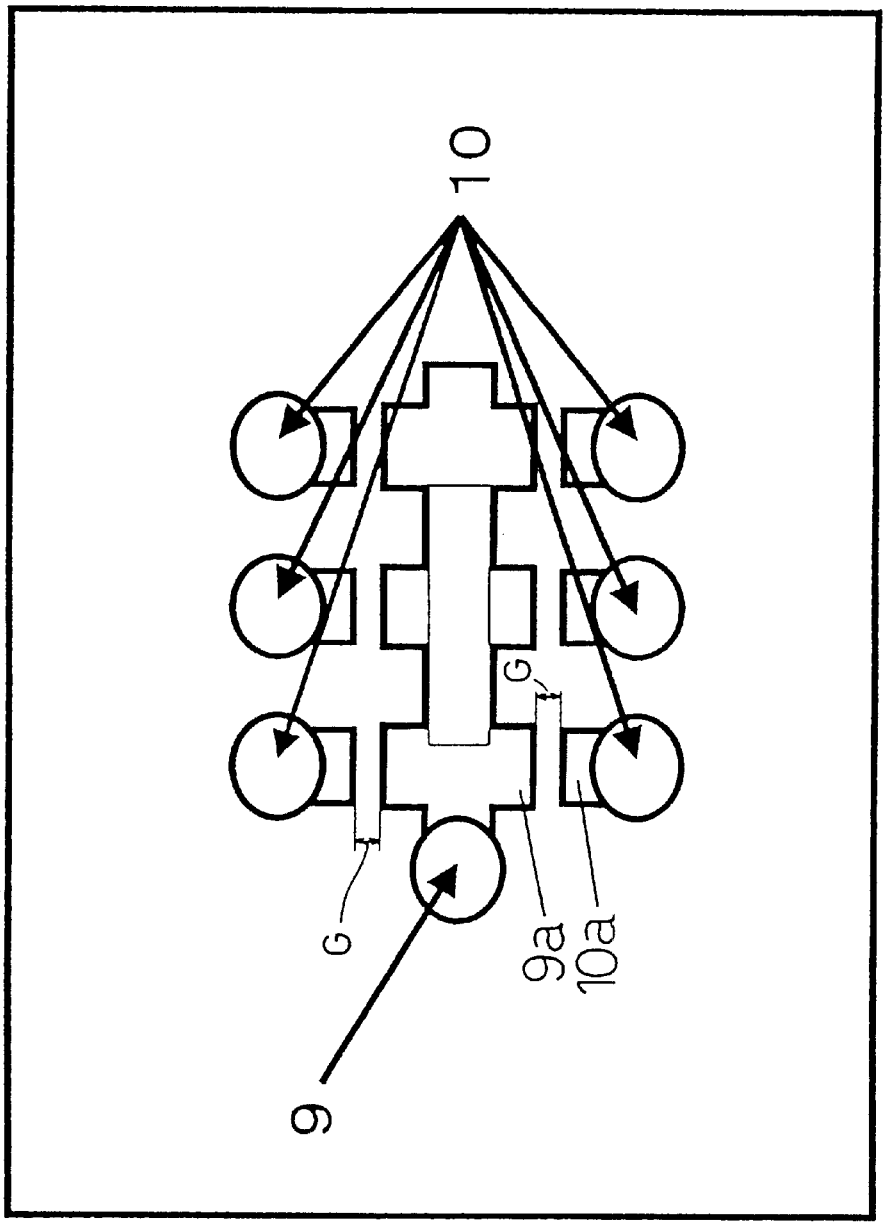
FIG. 1 is a schematic illustration of a comb-shaped electrode for a water drop test.

A water drop test pattern was made on a circuit board by the use of the conductive adhesive of the present preferred embodiment by a screen printing method. Then, the conductive adhesive was cured at a temperature of 120° C. for a period of 2 hours to make the above water drop test pattern a comb-shaped electrode for a water drop test. FIG. 1 is a schematic view of the comb-shaped electrode for the test. This comb-shaped electrode for the test was provided with terminal electrodes 9, 10, 10. The terminal electrode 9, was arranged in the center and the terminal electrodes 10, 10 were opposed to each other with the terminal electrode 9 therebetween. The gap G between the conductive pattern 9a of the terminal electrode 9 and the conductive pattern 10a of the terminal electrode 10 was set at 400 μm.

Next, a water drop test using the comb-shaped electrode for the test will be described. A predetermined amount of solution of phthalate having a pH of 4.01 was dropped on the gap G between the conductive pattern 9a of the terminal electrode 9 and the conductive pattern 10a of the terminal electrode 10. Further, a DC current of 1 V was applied across both the terminal electrodes 9, 10 and the time that elapsed before a current flowed between both the terminal electrodes 9, 10 was measured to evaluate an ion migration. Here, as shown in FIG. 1, six gaps G were measured to calculate the mean value thereof.

For comparison, a conductive adhesive was made to which the pH adjusting agent MgO was not added and then a comb-shaped electrode for the test was formed of the conductive adhesive. Then, the solution of phthalate having a pH of 4.01 or pure water was dropped on the gap between both the terminal electrodes 9, 10 and then the ion migration was evaluated by the same method described above. The results of evaluation will be shown in

TABLE 1

| pH adjusting agent | solvent used for test | time before migration occurs |
|---|---|---|
| not added | pure water | 75 seconds |
| not added | phthalate | 51 seconds |
| MgO | phthalate | 87 seconds |

As shown in Table 1, the comb-shaped electrode for the test made by the use of the conductive adhesive of the present preferred embodiment produced the following results because the MgO was added as the pH adjusting agent to the conductive adhesive: that is, although the dropping solution of phthalate had a pH of 4.01, which was biased to the acid side, the dropping solution showed stronger resistance to migration as compared with the test result obtained in the case where the dropping solution was pure water. This reason lies in the following.

If the pH adjusting agent MgO dissolves in the acid region, it shows the action of neutralizing the ambient atmosphere. Accordingly, even if the acid water enters the vicinity of the terminal electrodes 9,10 to bias the pH of the atmosphere in the vicinity of the terminals to the acid side, the ambient acid atmosphere is neutralized by the MgO dissolved by the entered water. This changes the pH in the vicinity of the conductive adhesive to the alkaline region to prevent Ag from dissolving, which results in improving the resistance to migration.

In this connection, a test use comb-shaped electrode was made of the conductive adhesive to which the MgO was added as the pH adjusting agent and then the time that elapsed before migration occurred in the case where pure water was used as a dropping solution was measured to obtain 429 seconds as the measurement result, although this is not shown in Table 1.

In contrast to this, the time that elapsed before the migration occurred in the case where the dropping solution made of pure water was dropped on the test use comb-shaped electrode to which the pH adjusting agent was not added was 75 seconds, as shown in Table 1. The comparison of these results of measurements clearly shows the effect of the addition of the pH adjusting agent in accordance with the present invention.

Also, although the pH adjusting agent MgO was added to the conductive adhesive of the present preferred embodiment, when the volume specific resistance of the conductive adhesive was measured, it could be verified that the conductive adhesive had a good volume specific resistance,. To be more specific, it could be verified that conductive adhesive had a good volume specific resistance of about $6.2 \times 10^{-5}$ Ωcm, which was the nearly identical to the result obtained in the case of the second preferred embodiment to be described below to which the pH adjusting agent ($Y_2O_3$) was added by 0.5 wt %.

Also, it could be verified that there was a correlation between the results of the water drop test shown in Table 1 and the results of a reliability test (unsaturated steam pressure bias test) conducted by using a mounting structure (to be described below) having a flip-chip-mounted semiconductor device as a sample. The reliability test will be described below.

The reliability test (unsaturated steampressure bias test) was conducted as follows: a DC voltage of 5.5 V was applied across the input/output electrodes on the circuit board in the atmosphere of a temperature of 110° C. and a humidity of 85% and the insulation resistance between the input/output electrodes and the connection resistances of the input/output electrodes were measured and evaluated. That is, the time that elapsed before the insulation resistance became less than $10^{10}$Ω or the connection resistance became more than 10 times the initial connection resistance was made are liability time. As a result, it could be verified that the reliability time was elongated in the sample having the pH adjusting agent MgO added thereto more than 5 times the sample having no pH adjusting agent.

While the MgO was used as the pH adjusting agent in the present preferred embodiment, a pH adjusting agent containing, instead of the MgO, or with the MgO, at least one member selected from the group consisting of $Mg(OH)_2$, $2MgO \cdot SiO_2$, $Al_2O_3$, $BaCO_3$, $SnO_2$, $La_2O_3$, $Mn_3O_4$, $MnO_2$, $CaCO_3$, $Ca(OH)_2$, $BaTiO_3$, $ZnO$, $CuO$, $Y_2O_3$, $Pr_2O_3$, $Pm_2O_3$, $Nd_2O_3$, $Y(OH)_3$, $Sc(OH)_3$, $Ce(OH)_3$, $Sm(OH)_3$, $Eu(OH)_3$, $Gd(OH)_3$, $Tb(OH)_3$, $Dy(OH)_3$, $Ho(OH)_3$, $Er(OH)_3$, $Tm(OH)_3$, $Yb(OH)_3$, $Lu(OH)_3$, $ZrO_2$, $Fe(OH)_2$, $Co(OH)_2$, $Ni(OH)_2$, $Cu(OH)_2$, $Cd(OH)_2$, $Zn(OH)_2$, $Bi_2O_3$, $La(OH)_3$, $Pr(OH)_3$, $Be(OH)_2$, $Al(OH)_3$, $V_2O_4$, $Cr(OH)_3 \cdot nH_2O$, $Ga(OH)_2$, and $PbO$ can also produce the same effect.

Although the epoxy base resin was used as the resin in the present preferred embodiment, it is not needless to say that either a thermoplastic resin or a thermosetting resin may be used as the resin.

(Second Preferred Embodiment)

In the present second preferred embodiment, a water-soluble substance $Y_2O_3$ is added in the state of powder, as a pH adjusting agent, instead of the MgO described above. The water-soluble substance $Y_2O_3$ as the pH adjusting agent is a substance which is in a solid state in the storage environment and/or the actual use environment of the conductive adhesive and keeps the solid state (the state of powder) and does not dissolve as far as it is not put into contact with water. Also, the water-soluble substance $Y_2O_3$ has a stable region in weak alkaline region like the MgO and if it dissolves in the acid region, it neutralizes the ambient atmosphere.

In the present preferred embodiment, the pH adjusting agent $Y_2O_3$ was formulated at the rates of 0.1 wt %, 0.5 wt %, 1.0 wt %, 3.0 wt %, 5.0 wt %, and 10.0 wt % to a conductive particle made of Ag, respectively, and was mixed with the epoxy resin by a publicly known method to make each conductive adhesive agent.

Here, if the amount of addition of the pH adjusting agent is less than 0.1 wt %, the amount of addition is too small to produce an effect of adjusting the pH. On the other hand, if the amount of addition is more than 10.0 wt %, it is difficult to adjust the viscosity of the conductive adhesive agent and a volume specific resistance is increased. Accordingly, the amount of addition in this range was excluded in the present preferred embodiment.

The conductive adhesive was formed into a sheet by a screen printing method and was cured at a temperature of 120° C. for a period of 2 hours and the resistance of the cured conductive adhesive agent was measured to calculate a volume specific resistance. The results will be shown in Table 2.

TABLE 2

| amount of addition of pH adjusting agent | volume specific resistance |
| --- | --- |
| 0.1 wt % | $6.0 \times 10^{-5}$ Ωcm |
| 0.5 wt % | $6.2 \times 10^{-5}$ Ωcm |
| 1.0 wt % | $6.6 \times 10^{-5}$ Ωcm |
| 3.0 wt % | $7.3 \times 10^{-5}$ Ωcm |
| 5.0 wt % | $8.0 \times 10^{-5}$ Ωcm |
| 10.0 wt % | $1.7 \times 10^{-4}$ Ωcm |

As shown in Table 2, the conductive adhesive of the present preferred embodiment had a good volume specific resistance in the range of the amount of addition of from 0.1 wt % to 1.0 wt %. In this connection, the volume specific resistance of the conductive adhesive to which the pH adjusting agent was not added was nearly equal to the good volume specific resistance of the conductive adhesive to which the pH adjusting agent was added by 0.1 wt %.

Also, the conductive adhesive of the present preferred embodiment produced the same effect on the resistance to migration as was described in the first preferred embodiment in all the amounts of addition except for 0.1 wt %. When the amount of pH adjusting agent was 0.1 wt %, the amount of addition was too small to produce the effect of adjusting the pH.

In this connection, in the case where MgO was added as the pH adjusting agent, even if the amount of addition of the MgO was 0.1 wt %, it could be verified that the pH adjusting agent could produce an effect on the resistance to migration.

It is thought that this is because a difference in the amount of addition to produce an effect on the resistance to migration between the MgO and the $Y_2O_3$ was caused by the fact that the MgO is more stable in an alkaline atmosphere than the $Y_2O_3$.

As described above, in the case where the amount of addition of the pH adjusting agent is more than 10.0 wt %, it is difficult to adjust the viscosity of the conductive adjusting agent, but it is possible to add the pH adjusting agent more than 10.0 wt % by specially adjusting the viscosity thereof. However, in that case, the volume specific resistance of the conductive adjusting agent tends to increase.

Also, in the present preferred embodiment and the first preferred embodiment described above, the particle size of the pH adjusting agent was not specially controlled. It is preferable that the particle size of the pH adjusting agent is finer than the size of the conductive particle. This is because there is a possibility that the electric conduction produced by the contact of the conductive particles may be impaired by the pH adjusting agent having a large particle size. On the other hand, if the particle size of the pH adjusting agent is too fine, it presents a problem that it is difficult to adjust the viscosity as the conductive adhesive. Accordingly, it is preferable that the particle size of the pH adjusting agent is controlled to be finer than the size of the conductive particle to be used.

(Third Preferred Embodiment)

In the present preferred embodiment, the present invention is applied to a conductive adhesive having conductive particles containing Al, which is different from the above-mentioned first and second preferred embodiments.

Al as the conductive particles is a metal showing low solubility in an acid region and high solubility in an alkaline region. Accordingly, if there exists an alkaline water in the surrounding of the conductive adhesive, the solution of Al is facilitated to increase the connection resistance of the conductive adhesive.

Accordingly, in the conductive adhesive of the present preferred embodiment, $In_2O_3$, was added as a pH adjusting agent, and this pH adjusting agent $In_2O_3$ was formulated at the rate of 0.5 wt % to the conductive particles containing Al and was then mixed with an epoxy base resin by a publicly known method to make the conductive adhesive.

The $In_2O_3$ as the pH adjusting agent is a substance which is in a solid state in the storage environment and/or the actual use environment of the conductive adhesive, and keeps the solid state (the state of powder) and does not dissolve as far as it does not contact water. Also, the $In_2O_3$ has a stable region in the acid region and if it dissolves in the alkaline region, it neutralizes the surrounding.

A comb-shaped electrode for the water drop test shown in FIG. 1 was made by the use of the conductive adhesive of the present preferred embodiment, as is the case with the first preferred embodiment described above.

Then, a predetermined amount of solution of borate having a pH of 9.18 was dropped on the gap G between the conductive patterns 9a and 10a of the fabricated comb-shaped electrode for the test. Further, a DC voltage of 1 V was applied across both the terminal electrodes 9, 10 and the time that elapsed before a current flowed between both the terminal electrodes 9, 10 was measured to evaluate an ion migration.

For comparison, a comb-shaped electrode for the water drop test was made by the use of the conductive adhesive to which the pH adjusting agent $In_2O_3$ was not added. Then, the solution of borate having a pH of 9.18 was dropped on the gap between both the electrodes 9, 10 of the fabricated comb-shaped electrode for the test to similarly evaluate the ion migration.

As a result, it could be verified that the conductive adhesive of the present preferred embodiment was made to have a good resistance to migration by adding $In_2O_3$ as the pH adjusting agent thereto. This is for the following reason: that is, as described above, if the pH adjusting agent $In_2O_3$ dissolves in the alkaline region, it neutralizes the surrounding of the conductive adhesive, and thus the pH in the vicinity of the conductive adhesive changes to the acid region to prevent the dissolution of Al to improve the resistance to migration.

Also, although the pH adjusting agent $In_2O_3$ was added to the conductive adhesive of the present preferred embodiment, when the volume specific resistance of the conductive adhesive was measured, it could be verified that the conductive adhesive had a good volume specific resistance. To be more specific, it could be verified that conductive adhesive had a good volume specific resistance of about $6.2 \times 10^{-5}$ Ωcm, which was the nearly identical to the result obtained in the case of the second preferred embodiment described above to which the pH adjusting agent ($Y_2O_3$) was added by 0.5 wt %

While the $In_2O_3$ was used as the pH adjusting agent in the present preferred embodiment, a pH adjusting agent containing, instead of the $In_2O_3$, or with the $In_2O_3$, at least one member selected from the group consisting of $TeO_2$, $CeO_2$, $TeO_2$, $WO_3$, $Gd(OH)_3$, $BeO$, $GeO_2$, $Cr_2O_3$, $V_2O_5$, $Be(OH)_2$, $Al(OH)_3$, $V_2O_4$, $Cr(OH)_3 \cdot nH_2O$, $Ga(OH)_2$, and $PbO$ can produce the same effect.

(Fourth Preferred Embodiment)

Figure 2:
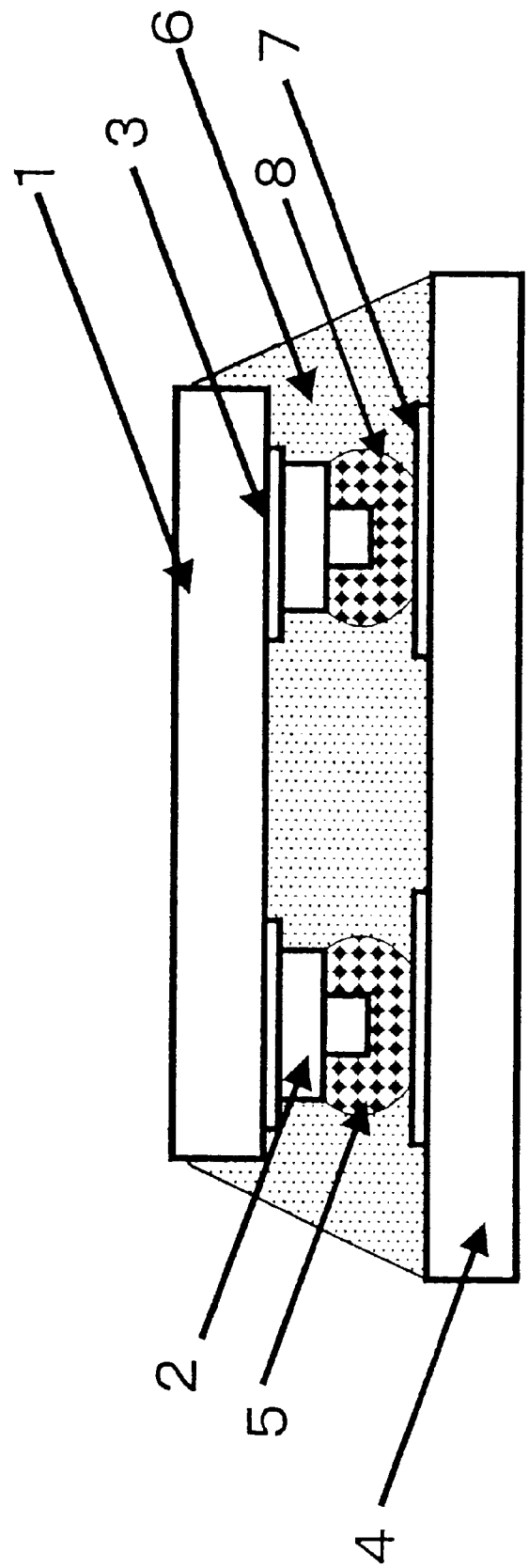
FIG. 2 is a schematic cross sectional view of a mounting structure using a conductive adhesive containing a pH adjusting agent.
Figure 3:
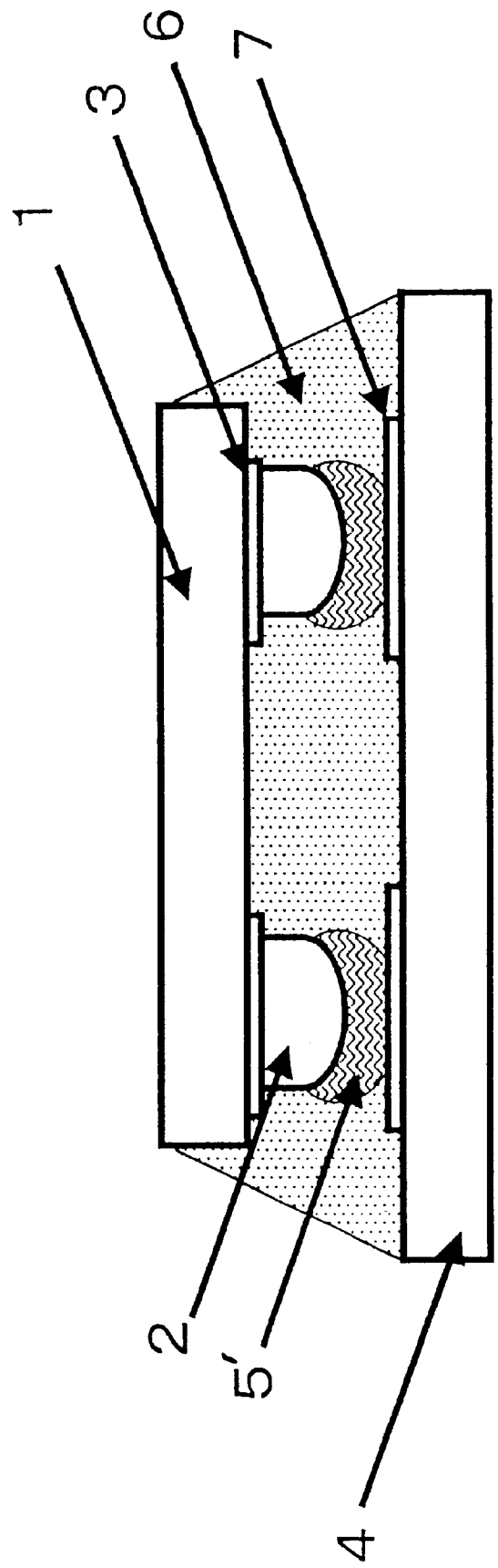
FIG. 3 is a schematic cross sectional view of a mounting structure using a conductive adhesive.

FIG. 2 is a schematic cross sectional view of a mounting structure of a semiconductor device using a conductive adhesive containing the pH adjusting agent in accordance with the present invention.

While a mounting structure in which a semiconductor is mounted on a circuit board will be described in the present preferred embodiment, a mounting structure in which an electronic part is mounted on a circuit board is the same.

A projecting electrode 2 to be an electronic connection point was formed on the electrode pad 3 of an IC board 1. In the present preferred embodiment, the projecting electrode 2 was formed in the following way: that is, a Au wire was melted to form a ball with a bump bonder device, which was an improved wire boding device, and then the Au ball was bonded to the electrode pad 3 by applying ultrasonic wave, heat and pressure to form the projecting electrode 2.

In the present preferred embodiment, the projecting electrode 2 was formed of Au, but it may be formed of solder and a plating method may be used as a forming method.

Next, a semiconductor device was flip chip mounted on a circuit board 4 by a publicly known method. Here, the semiconductor was electrically connected to the circuit board 4 by a conductive adhesive layer 5: that is, the input/output electrode 7 of the circuit board 4 was electrically connected to the projecting electrode 2 of the semiconductor device. In the present preferred embodiment, the conductive adhesive layer 5 was constituted in the following way: that is, basically, the conductive adhesive layer 5 was the conductive adhesive described in the first preferred embodiment (to which MgO was added as the pH adjusting agent) and was formed of a conductive adhesive formed of the pH adjusting agent having a particle size smaller than 20 μm.

Such a conductive adhesive layer 5 was formed and after the semiconductor device was mounted on the circuit board 4, the conductive adhesive layer 5 was cured. Then, a sealing resin 6 was supplied to the gap between the IC board 1 and the circuit board 4 and was then cured to form a mounting structure.

In the mounting structure of the present preferred embodiment, the pH adjusting agent capable of adjusting the pH was added to the conductive adhesive 5 establishing an electrical connection in the vicinity of the conductive particles 8 and thus could prevent the dissolution of the conductive particles 8 to improve reliability. Also, since the pH adjusting agent used in the present preferred embodiment produces the effect of adjusting the pH even if the amount of addition of the pH adjusting agent is small, it does not increase the volume specific resistance which is the main property of the conductive adhesive.

The above mentioned effect can be verified by the reliability test described in the above mentioned first preferred embodiment. Also, while the mounting structure was constituted by the conductive adhesive to which the pH adjusting agent (MgO or the like) dissolving in the acid region to show a neutralizing action was added in the present preferred embodiment, it is needless to say that the mounting structure may be constituted by the conductive adhesive to which the pH adjusting agent ($In_2O_3$ or the like) dissolving in the alkaline region to show a neutralizing action is added. In short, it is recommended that the pH adjusting agent be selected according to the degree of the pH of the water which enters the surrounding of the conductive adhesive and is affected by the ambient atmosphere.

Further, by making the particle size of the pH adjusting agent added to the conductive adhesive smaller than 20 μm, it is possible control the amount transfer of the conductive adhesive 5 to the projecting electrode 2 and to fabricate a mounting structure having a stable initial connection resistance.

While the present invention has been applied to the resin base conductive adhesive containing resin in the above preferred embodiments, the present invention may be applied to a rubber base conductive adhesive or may be applied also to a conductive rubber or the like in addition to the conductive adhesive.

While the present invention has been described in detail in the preferred embodiments, the combination and arrangement of the parts in the preferred embodiments can be variously modified within the spirit and scope of the appended claims.

What is claimed is:

1. A conductive composition comprising:
   at least one of resin and rubber; and
   a combination of a conductive particle and a water-soluble PH adjusting agent, said pH adjusting agent having a wt. % from 0.1–10% with respect to said conductive particle.

2. The conductive composition as set forth in claim 1, wherein the pH adjusting agent changes a pH environment in which the conductive particle is easy to dissolve in the surrounding of the conductive composition to a pH environment in which the conductive particle is resistant to dissolving.

3. The conductive composition as set forth in claim 1, wherein the pH adjusting agent is a substance which is in a solid state in at least one of the storage environment and actual use environment of the conductive composition.

4. The conductive composition as set forth in claim 3, wherein the pH adjusting agent is added in the state of powder.

5. A conductive adhesive comprising:
at least one of resin and rubber; and
a combination of a conductive particle and a water-soluble pH adjusting agent, said pH adjusting agent having a wt. % from 0.1–10% with respect to said conductive particle.

6. The conductive adhesive as set forth in claim 5, wherein the pH adjusting agent changes a pH environment in which the conductive particle is easy to dissolve in the surrounding of the conductive composition to a pH environment in which the conductive particle is resistant to dissolving.

7. The conductive adhesive as set forth in claim 5, wherein the pH adjusting agent is a substance which is in a solid state in at least one of the storage environment and actual use environment of the conductive composition.

8. The conductive adhesive as set forth in claim 7, wherein the pH adjusting agent is added in the state of powder.

9. The conductive adhesive as set forth in claim 8, wherein the pH adjusting agent has a particle size smaller than the conductive particle.

10. The conductive adhesive as set forth in claim 9, wherein the pH adjusting agent has a particle size smaller than 20 $\mu$m.

11. The conductive adhesive as set forth in claim 5, wherein the conductive particle contains at least one metal selected from the group consisting of Ag, Al, Au, Cu, and Ni.

12. The conductive adhesive as set forth in claim 6, wherein the conductive particle contains a metal showing lower solubility in an alkaline region than in an acid region and wherein the pH adjusting agent has a stable region in the alkaline region.

13. The conductive adhesive as set forth in claim 12, wherein the conductive particle contains Ag.

14. The conductive adhesive as set forth in claim 12, wherein the pH adjusting agent contains at least one member selected from the group consisting of MgO, Mg(OH)$_2$, 2MgO.SiO$_2$, Al$_2$O$_3$, BaCO$_3$, SnO$_2$, La$_2$O$_3$, Mn$_3$O$_4$, MnO$_2$, CaCO$_3$, Ca(OH)$_2$, BaTiO$_3$, ZnO, CuO, Y$_2$O$_3$, Bi$_2$O$_3$, Pr$_2$O$_3$, Pm$_2$O$_3$, Nd$_2$O$_3$, Y(OH)$_3$, Sc(OH)$_3$, Ce(OH)$_3$, Sm(OH)$_3$, Eu(OH)$_3$, Gd(OH)$_3$, Tb(OH)$_3$, Dy(OH)$_3$, Ho(OH)$_3$, Er(OH)$_3$, Tm(OH)$_3$, Yb(OH)$_3$, Lu(OH)$_3$, ZrO$_2$, Fe(OH)$_2$, Co(OH)$_2$, Ni(OH)$_2$, Cu(OH)$_2$, Cd(OH)$_2$, Zn(OH)$_2$, La(OH)$_3$, Pr(OH)$_3$, Be(OH)$_2$, Al(OH)$_3$, V$_2$O$_4$, Cr(OH)$_3$.nH$_2$O, Ga(OH)$_2$, and PbO.

15. The conductive adhesive as set forth in claim 12, wherein the pH adjusting agent contains at least one member selected from the group consisting of MgO, Mg(OH)$_2$, 2MgO.SiO$_2$, and Ca(OH)$_2$.

16. The conductive adhesive as set forth in claim 6, wherein the conductive particle contains a metal showing lower solubility in an acid region than in an alkaline region and wherein the pH adjusting agent has a stable region in the acid region.

17. The conductive adhesive as set forth in claim 16, wherein the conductive particle contains Al.

18. The conductive adhesive as set forth in claim 16, wherein the pH adjusting agent contains at least one member selected from the group consisting of In$_2$O$_3$, TeO$_2$, GeO$_2$, WO$_3$, Gd(OH)$_3$, BeO, Cr$_2$O$_3$, V$_2$O$_5$, Be(OH)$_3$, Al(OH)$_3$, V$_2$O$_4$, Cr(OH)$_3$.nH$_2$O$_2$, Ga(OH)$_2$, and PbO.

19. A mounting structure comprising:
an electronic part;
a circuit board on which the electronic part is mounted; and
a conductive adhesive layer for connecting the electronic part to the circuit board,
wherein the conductive adhesive layer comprises at least one of resin and rubber; and a combination of a conductive particle and a water-soluble pH adjusting agent, said pH adjusting agent having a wt. % from 0.1–10% with respect to said conductive particle.

20. The mounting structure as set forth in claim 19, wherein the electronic part is a semiconductor.

21. The mounting structure as set forth in claim 19, wherein the pH adjusting agent changes a pH environment in which the conductive particle is easy to dissolve in the surrounding of the conductive composition to a pH environment in which the conductive particle is resistant to dissolving.

22. The mounting structure as set forth in claim 19, wherein the pH adjusting agent is a substance which is in a solid state in at least one of the storage environment and actual use environment of the conductive composition.

23. The mounting structure as set forth in claim 22, wherein the pH adjusting agent is added in the state of powder.

24. The mounting structure as set forth in claim 23, wherein the pH adjusting agent has a particle size smaller than the conductive particle.

25. The mounting structure as set forth in claim 24, wherein the pH adjusting agent has a particle size smaller than 20 $\mu$m.

26. The mounting structure as set forth in claim 19, wherein the conductive particle contains at least one metal selected from the group consisting of Ag, Al, Au, Cu, and Ni.

27. The mounting structure as set forth in claim 21, wherein the conductive particle contains a metal showing lower solubility in an alkaline region than in an acid region and wherein the pH adjusting agent has a stable region in the alkaline region.

28. The mounting structure as set forth in claim 27, wherein the conductive particle contains Ag.

29. The mounting structure as set forth in claim 27, wherein the circuit board has resin as a main component.

30. The mounting structure as set forth in claim 29, wherein the pH adjusting agent contains at least one member selected from the group consisting of MgO, Mg(OH)$_2$, 2MgO.SiO$_2$, Al$_2$O$_3$, BaCO$_3$, SnO$_2$, La$_2$O$_3$, Mn$_3$O$_4$, MnO$_2$, CaCO$_3$, CaCO$_3$, Ca(OH)$_2$, BaTiO$_3$, ZnO, CuO, Y$_2$O$_3$, Bi$_2$O$_3$, Pr$_2$O$_3$, Pm$_2$O$_3$, Nd$_2$O$_3$, Y(OH)$_3$, Sc(OH)$_3$, Ce(OH)$_3$, Sm(OH)$_3$, Eu(OH)$_3$, Gd(OH)$_3$, Tb(OH)$_3$, Dy(OH)$_3$, Ho(OH)$_3$, Er(OH)$_3$, Tm(OH)$_3$, Yb(OH)$_3$, Lu(OH)$_3$, ZrO$_2$, Fe(OH)$_2$, Co(OH)$_2$, Ni(OH)$_2$, Cu(OH)$_2$, Cd(OH)$_2$, Zn(OH)$_2$, La(OH)$_3$, Pr(OH)$_3$, Be(OH)$_2$, Al(OH)$_2$, V$_2$O$_4$, Cr(OH)$_2$.nH$_2$O, Ga(OH)$_2$, and PbO.

31. The mounting structure as set forth in claim 27, wherein the pH adjusting agent contains at least one member selected from the group consisting of MgO, Mg(OH)$_2$, 2MgO.SiO$_2$, and Ca(OH)$_2$.

32. The mounting structure as set forth in claim 21, wherein the conductive particle contains a metal showing lower solubility in an acid region than in an alkaline region and wherein the pH adjusting agent has a stable region in the acid region.

33. The mounting structure as set forth in claim 32, wherein the conductive particle contains Al.

34. The mounting structure as set forth in claim 32, wherein the pH adjusting agent contains at least one member selected from the group consisting of In$_2$O$_3$, TeO$_2$, GeO$_2$, WO$_3$, Gd(OH)$_3$, BeO, Cr$_2$O$_3$, V$_2$O$_5$, Be(OH)$_2$, Al(OH)$_3$, V$_2$O$_4$, Cr(OH)$_3$.nH$_2$O, Ga(OH)$_2$, and PbO.

* * * * *

UNITED STATES PATENT AND TRADEMARK OFFICE
CERTIFICATE OF CORRECTION

PATENT NO.   : 6,468,448 B1
DATED        : October 22, 2002
INVENTOR(S)  : Kazuyoshi Amami et al.

It is certified that error appears in the above-identified patent and that said Letters Patent is hereby corrected as shown below:

Column 12,
Line 39, change "29" to -- 27 --
Line 43, delete the second "$CaCO_3$"

Signed and Sealed this

Twelfth Day of August, 2003

JAMES E. ROGAN
*Director of the United States Patent and Trademark Office*